ns*US006562149B1*

United States Patent
Grieser et al.

(10) Patent No.: US 6,562,149 B1
(45) Date of Patent: May 13, 2003

(54) SOLUTION AND PROCESS TO PRETREAT COPPER SURFACES

(75) Inventors: Udo Grieser, Berlin (DE); Heinrich Meyer, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 09/601,494

(22) PCT Filed: Jan. 25, 1999

(86) PCT No.: PCT/DE99/00243

§ 371 (c)(1),
(2), (4) Date: Aug. 22, 2000

(87) PCT Pub. No.: WO99/40764

PCT Pub. Date: Aug. 12, 1999

(30) Foreign Application Priority Data

Feb. 3, 1998 (DE) .......................... 198 06 190
Jun. 26, 1998 (DE) .......................... 198 30 038

(51) Int. Cl.$^7$ .............................................. C23C 22/48
(52) U.S. Cl. .................. 148/270; 148/274; 148/282; 106/14.16; 106/14.17; 252/389.54; 252/390; 252/391; 252/394
(58) Field of Search ............................ 148/260, 270, 148/274, 282; 106/14.16, 14.17; 252/389.54, 390, 391, 394

(56) References Cited

U.S. PATENT DOCUMENTS

| | | |
|---|---|---|
| 3,645,772 A | 2/1972 | Jones |
| 3,770,530 A | 11/1973 | Fujimoto |
| 3,801,512 A | 4/1974 | Solenberger |
| 4,051,057 A | 9/1977 | Ericson et al. |
| 4,140,646 A | 2/1979 | Kent et al. |
| 4,158,593 A | 6/1979 | Allan |
| 4,373,744 A | 2/1983 | Kawanabe et al. |
| 4,784,785 A * | 11/1988 | Cordani et al. ............ 216/100 |
| 4,915,781 A * | 4/1990 | Bohnen et al. ............ 216/107 |
| 4,917,758 A | 4/1990 | Ishizuka |
| 5,800,859 A * | 9/1998 | Price et al. ............ 106/14.05 |

FOREIGN PATENT DOCUMENTS

| | | |
|---|---|---|
| EP | 0 670 370 A | 9/1995 |
| JP | 08-0097599 | 4/1996 |
| WO | PCT/GB95/02909 | 6/1996 |

OTHER PUBLICATIONS

Search report issued out of Austrian Patent Office on Singapore patent application No. SG 9903080–1.

* cited by examiner

Primary Examiner—John Sheehan
Assistant Examiner—Andrew L. Oltmans
(74) Attorney, Agent, or Firm—Paul & Paul

(57) ABSTRACT

The invention concerns processes and solutions for the preliminary treatment of copper surfaces which are subsequently to be firmly bonded to organic substrates. The solution is used, in particular, for firmly bonding laminated multilayered printed circuit boards and for firmly bonding resists to the copper surfaces of printed circuit boards. The solutions contain (a) hydrogen peroxide; (b) at least one acid; (c) at least one nitrogen-containing, five-membered heterocyclic compound which does not contain any sulphur, selenium or tellurium atom in the heterocycle; and (d) at least one adhesive compound from the group consisting of sulfinic acids, seleninic acids, tellurinic acids, heterocyclic compounds containing at least one sulphur, selenium and/or tellurium atom in the heterocycle, and sulfonium, selenonium and telluronium salts having the general formula (A),

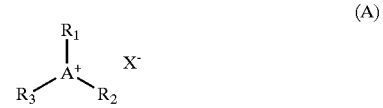

(A)

in which A stands for S, Se or Te; $R_1$, $R_2$ and $R_3$ stand for alkyl, substituted alkyl, alkenyl, phenyl, substituted phenyl, benzyl, cycloalkyl, substituted cycloalkyl, $R_1$, $R_2$ and $R_3$ being the same or different; and $X^-$ stands for an anion of an inorganic or organic acid or hydroxide, provided that the acid selected to constitute component (b) is not identical to the sulfinic, seleninic or tellurinic acids selected as component (d).

20 Claims, No Drawings

SOLUTION AND PROCESS TO PRETREAT COPPER SURFACES

DESCRIPTION

The invention concerns a solution and a process to pretreat copper surfaces so that a tight bond can be subsequently formed between the pretreated copper surfaces and plastic substrates. The solution preferably serves to pretreat copper-coated inner layers of printed circuit boards to subsequently allow a tight bond between the inner layers of the printed circuit board and the board's inner layers made of artificial resins, and to pretreat copper-coated printed circuit boards to create a tight bond between the copper coating and plastic resists.

In manufacturing printed circuit boards, various steps are carried out in which copper surfaces must be tightly bonded to an organic substrate. In some cases, the required adhesion of the formed bonds must be ensured over a long period. In other cases, a tight bond only has to exist for a short period, e.g. when the organic substrate only remains on the copper surfaces during manufacture of the printed circuit board. For example, the tight bond of dry film resists (for structuring conductor lines on printed circuit boards) to the copper surfaces only has to exist while manufacturing the printed circuit board. After the conductor line structures are formed, the resists can be removed.

The easiest way to increase the adhesion is to etch and hence roughen the copper surfaces before forming the bond. Microetching solutions are used such as sulfuric acid solutions of hydrogen peroxide or sodium peroxodisulfate.

Another procedure is described in U.S. Pat. No. 3,645,772. A pretreatment solution is used for the copper surfaces that e.g. contains 5-aminotetrazole.

Long-term stability is especially necessary when laminating multilayer printed circuit boards. Other treatments for the copper surfaces are required in this case.

When manufacturing multilayer boards, several inner layers are laminated to insulating artificial resin layers (so-called prepregs: epoxide resin films reinforced with fiberglass nets). The inner bonds of the laminate must hold throughout the entire life of the printed circuit board. The copper layers (preferably the conductor line structures) on the inner layers must be surface-treated. Various procedures have been developed to solve this problem.

The normal procedure for pretreating the materials before lamination is to form an oxide layer on the copper surfaces. In this process, known as the brown or black oxide process, very aggressive reaction conditions are used to form the oxide. A disadvantage of this procedure is that the oxide layer used for enhancing adhesion to the artificial resin layer is not very resistant to acid and especially to hydrochloric treatment solutions. They are hence attacked in subsequent processes for plating the through-holes in the boards. The adhesive bond is eliminated, and delamination occurs at the attacked sites (pink ring: An externally-visible attack on the black oxide layer directly next to a hole in printed circuit boards with the discoloration of the originally black oxide layer. The pink copper coating of the inner layer is recognizable as an annular defect; wedge void: A defect (recognizable in a micrograph of a treated hole) in a printed circuit board in the form of a crack between a copper inner layer and the neighboring printed circuit board resin from the attack of acid treatment solutions on the black oxide layer).

The above-cited problem is solved by reducing the oxide layer surface before lamination. The reduced black oxide is more stable than normal black oxide against chemicals used in plating the through-holes. The additional reduction step costs a great deal, however. In addition, the chemicals used for reduction are not very resistant to oxidation from air, so that the useful life of the baths and storage life of the supplementary chemicals are limited. An attempt to eliminate this problem is made in JP A 08097559. The reduced copper oxide layers are provided with a protective layer by treating them with an aqueous solution containing an aminothiazole and/or aminobenzothiazole compound. However, the problems of expensive reduction chemicals, their low resistance to oxidation and the layer's sensitivity to acid are not completely eliminated.

Another option for promoting adhesion is to treat the copper surfaces with an aqueous or alcoholic solution of an azole compound. Such a procedure is e.g. presented in WO 96/19097 A1. The copper surfaces are treated with a solution that contains 0.1–20 weight percent hydrogen peroxide, an inorganic acid (e.g. sulfuric acid), an organic corrosion inhibitor (e.g. benzotrizole), and a wetting agent. The hydrogen peroxide etches the copper surface to produce microrough surfaces.

U.S. Pat. No. 4,917,758 discloses etching solutions that, however, serve to etch copper cladding on the materials of the printed circuit board. Hydrogen peroxide, sulfuric acid and a nitrogen-containing compound (preferably amino benzoic acid, amino tetrazole or phenylurea) are also in these solutions.

The present invention is therefore based on the problem of avoiding the disadvantages of the state of the art and finding a pretreatment solution and a process that can create a tight bond between the copper surfaces and plastic surfaces. The process should be simple, easy to use, and inexpensive. It is also important that treatment with the solutions produce a material bond that is not problematic (no pink ring and wedge voids) in the subsequent p.c.b. manufacturing processes, e.g. plating through-holes in board materials. The used pretreatment solutions should therefore be suitable for manufacturing printed circuit boards.

This problem is solved by the solution cited in claim 1 and the treatment process cited in claim 18.

The solution according to the invention is for pretreating copper surfaces to allow a tight bond to be formed with plastic substrates, and it contains:

a. Hydrogen peroxide, b. At least one acid, and c. At least one nitrogen-containing, five-member heterocyclic compound that does not contain sulfur, selenium or tellurium atoms in the heterocycle, and d. At least one adhesion-promoting compound from the group of sulfinic acid, selenic acid, telluric acid, heterocyclic compounds that contain at least one sulfur, selenium and/or tellurium atom in the heterocycle, as well as sulfonium, selenonium and telluronium salts, where the sulfonium, selenonium and telluronium salts are compounds of general formula A:

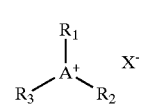

where A=S, Se or Te, $R_1$, $R_2$ and $R_3$=alkyl, substituted alkyl, alkenyl, phenyl, substituted phenyl, benzyl, cycloalkyl, substituted cycloalkyl, where $R_1$, $R_2$ and $R_3$ are the same or different, and X−=anion of an inorganic or organic acid or hydroxide, with the proviso that the acid selected for component b is not identical with the sulfinic, selenic or telluric acid selected for component d.

Adhesion-promoting compounds are to be selected that are sufficiently soluble in the acidic, preferably sulfuric acid solution.

The process according to the invention is carried out by bringing the copper surfaces into contact with the solution.

The problem on which the invention is based is solved in particular by the uses for the solution according claims 19 and 20. The cited solution is preferably used to pretreat copper-coated inner layers of printed circuit boards to allow a tight bond to be formed between the inner layers of the printed circuit boards and plastic resin layers, and to pretreat copper-coated printed circuit boards so that a tight bond can be formed between the copper coatings and plastics resists.

Preferred embodiments of the invention are found in the subclaims.

Preferred sulfinic acids are adhesion-promoting compounds of chemical formula B:

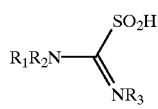

with $R_4$, $R_5$ and $R_6$=hydrogen, alkyl, substituted alkyl, phenyl, substituted phenyl or $R_7$—(CO)— with $R_7$=hydrogen, alkyl, substituted alkyl, phenyl or substituted phenyl, where $R_4$, $R_5$ and $R_6$ can be the same or different, and aromatic sulfinic acids.

It is preferable for the solution to contain formamidine sulfinic acid as the adhesion-promoting compound. Preferable aromatic sulfinic acids are benzene sulfinic acid, toluene sulfinic acids, chlorobenzene sulfinic acids, nitrobenzene sulfinic acids and carboxybenzene sulfinic acids.

Other preferable adhesion-promoting heterocyclic compounds are thiophene, thiazole, isothiazole, thiadiazole and thiatriazole.

Suitable thiophenes are compounds of chemical formula C:

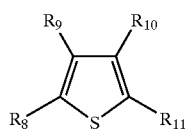

with $R_8$, $R_9$, $R_{10}$, $R_{11}$=hydrogen, alkyl, substituted alkyl, phenyl,substituted phenyl, halogen, amino, alkylamino, dialkylamino, hydroxy, alkoxy, carboxy, carboxyalkyl, alkoxycarbonyl, aminocarbonyl, $R_{12}$—CONH— with $R_{12}$=hydrogen, alkyl, substituted alkyl, phenyl or substituted phenyl, where $R_8$, $R_9$, $R_{10}$ and $R_{11}$ can be the same or different and can be a part of homo or heterocyclic rings condensed onto the thiophene ring.

Particularly preferred thiophenes are aminothiophene carboxylic acids, their esters and amides. For example, 3-aminothiophene-2-carboxylic acid methyl ester can be advantageously used.

Suitable thiazoles are compounds of chemical formula D:

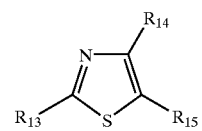

with $R_{13}$, $R_{14}$, $R_{15}$=hydrogen, alkyl, substituted alkyl, phenyl, substituted phenyl, halogen, amino, alkylamino, dialkylamino, hydroxy, alkoxy, carboxy, carboxyalkyl, alkoxycarbonyl, aminocarbonyl, $R_{16}$—CONH— with $R_{16}$=hydrogen, alkyl, substituted alkyl, phenyl or substituted phenyl, where $R_{13}$, $R_{14}$ and $R_{15}$ can be the same or different and can be a part of homo or heterocyclic ring condensed onto the thiazole ring.

Particularly suitable thiazoles are aminothiazole and substituted aminothiazole.

Other preferred thiadiazole adhesion-promoting compounds are from the group, consisting of aminothiadiazoles and substituted aminothiadiazoles.

In addition, the preferred sulfonium salts used as adhesion-promoting compounds are salts of trimethylsulfonium, triphenylsulfonium, methionine alkylsulfonium and methionine benzylsulfonium.

The nitrogen-containing, five-member heterocyclic compounds that do not contain any sulfur, selenium or tellurium atom in the heterocycle can be monocyclic and polycyclic condensed ring systems. For example, the compounds can contain an anellated benzene, naphthalene or pyrimidine ring. When selecting these compounds, make sure that they are sufficiently soluble in the acid solution. It is preferable for the solution to contain triazoles, tetrazoles, imidazoles, pyrazoles and purines or their derivatives.

In particular, the solution contains triazoles of chemical formula E1:

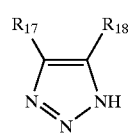

with $R_{17}$, $R_{18}$=hydrogen, alkyl, substituted alkyl, amino, phenyl, substituted phenyl, carboxyalkyl, where $R_{17}$ and $R_{18}$ can be the same or different and can be a part of the homo or heterocyclic ring condensed onto the triazole ring.

Benzotriazole, methylbenzotriazole, ethylbenzotriazole and dimethylbenzotriazole are particularly preferable.

In addition, the solution can contain tetrazoles of chemical formula E2:

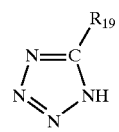

with $R_{19}$=hydrogen, alkyl, substituted alkyl, halogenalkyl, amino, phenyl, substituted phenyl, benzyl, carboxy, carboxyalkyl, alkoxycarbonyl, aminocarbonyl, $R_{20}$—CONH with $R_{20}$=hydrogen, alkyl, substituted alkyl, phenyl or substituted phenyl.

Preferred tetrazole compounds may be 5-aminotetrazole and 5-phenyltetrazole. A preferred imidazole compound may be benzimidazole. 5-aminotetrazole, 5-phenyltetrazole, benzotriazole, methylbenzotriazole and ethylbenzotriazole are preferred compounds given their favorable solubility in the pretreatment solution and their availability.

Preferred combinations are benzotriazole, methylbenzotriazole, ethylbenzotriazole, 5-aminotetrazole and 5-phenyltetrazole as the nitrogen-containing, heterocyclic compounds with aminothiophene carboxylic acids, their esters and amides, aminothiazoles and substituted aminothiazoles as the heterocyclic compounds.

The process according to the invention is an extremely easy way to pretreat copper surfaces to allow them to tightly bond with plastics. Basically one step is necessary, i.e., treating the copper surface with the solution according to the invention to allow them to bond with organic substrates. The adhesion does not decrease even after a long time. If the adhesion-promoting compounds are not in the solution, such bond strength cannot be attained. In addition, the long-term stability of the bond after treating the copper with solution without the invention's adhesion-promoting compounds is substantially lower than when solution is used with the adhesion-promoting compound.

In addition, the problems that arise in conjunction with plating through-holes in printed circuit boards (i.e., the formation of pink ring and wedge voids) are avoided by using these additional compounds in the treatment solution. The adhesion-promoting layers created using the solution according to the invention have an excellent acid resistance, whereas black oxide and reduced black oxide layers are somewhat sensitive to hydrochloric acid solutions. It has even been shown that the adhesion of copper to organic substrates can be improved in certain cases when the copper surfaces are treated with diluted acid after being treated using the solution according to the invention and before the bond is created. It is preferable to use hydrochloric acids for this.

The advantageous effect of the solution according to the invention was surprising since the desired long-term adhesion is not produced when just the adhesion-promoting compounds are used in the treatment solution. When both solution components are used, the copper surfaces change color, and the desired results are produced.

The copper surfaces should first be cleaned to ensure that the pretreatment is effective. Any conventional cleaning solution can be used. Normally, wetting agents and sometimes complexer (such as triethanol-amine)-containing aqueous solutions are used.

After the cleaned copper surfaces are rinsed, they can be brought into contact with a so-called predippping solution that contains one of the five-member heterocyclic compounds (component c) dissolved in water, preferably at a concentration of 0.1–10 g/l, and especially 0.5–2 g/l. This treatment helps the adhesion-promoting layer to be formed in the subsequent treatment step. In particular, any delays in the formation of the layer are avoided. The layer starts forming directly when the surface contacts the solution of the invention.

The surfaces are then treated with the solution according to the invention without being rinsed beforehand. As the adhesion-promoting layer is formed, the copper surfaces change color from pink to a brown tint depending on the combination of nitrogen-containing, five-member heterocyclic and adhesion-promoting compounds.

The microetching by the hydrogen peroxide in connection with the acid yields microrough copper surfaces. Since this increases the surface area, the subsequent adhesion of the copper surfaces to the plastic substrate also increases. The change in color of the surface during treatment is caused by a thin copper oxide layer. It is also suspected that the adhesion is also improved by the formation of a copper organic compound that forms on the copper surface and probably consists of copper or copper oxide, the nitrogen-containing compound, and the adhesion-promoting compound. It is preferable for the acid in the solution according to the invention to be an inorganic acid, and especially sulfuric acid. Other acids can of course be used.

To stabilize hydrogen peroxide against decomposition, the solution can contain other compounds (such as p-phenolsulfonic acid) and water as the solvent in addition to other organic solvents like alcohols, e.g. to increase the solubility of the contained components, especially the nitrogen-containing, five-member heterocyclic compounds and the adhesion-promoting compounds.

In addition, other inorganic and organic compounds can be in the solutions, e.g., copper sulfate and wetting agents.

The treatment is preferably carried out at 20–60° C. The treatment time is preferably 10–600 sec. The higher the temperature, the faster-acting the solution. The treatment times can hence even be much shorter. From a practical standpoint, a preferable average temperature would be 35–45° C. to better control the reaction. Average treatment times are 20–90 sec. In addition, a top temperature limit may have to be set due to possible incompatibilities between certain solution components at high temperatures, e.g., wetting agents that have difficulty dissolving at high temperatures.

The preferable concentration ranges in the solution are:

| | |
|---|---|
| Sulfuric acid, conc. | 10–250 g/l |
| Hydrogen peroxide, 30 weight percent | 1–100 g/l |
| Five-member, nitrogen-containing heterocyclic compounds | 0.5–50 g/l |
| Adhesion-promoting compounds: | |
| Sulfinic, selenic and/or telluric acid | 0.05–10 g/l |
| Adhesion-promoting heterocyclic compound | 0.05–20 g/l |
| Sulfonium, selenonium and/or telluronium salts | 0.01–10 g/l |

The optimum concentrations for the cited bath components depend on the type of nitrogen-containing heterocyclic compounds and adhesion-promoting compounds.

After they are treated with the solution according to the invention, the copper surfaces are rinsed, preferably with warm, deionized water. Then they are dried, e.g. with hot air.

Optionally, the copper surfaces can also be treated with diluted acid after being rinsed, preferably with 10 weight percent hydrochloric acid or 10 weight percent sulfuric acid. Treatment times of 5–300 sec. are useful. After being treated with acid, the copper surfaces are again rinsed, preferably with deionized water.

To increase the useful life of the solutions of the invention, it is a good idea to prepare the ready-for-use treatment solutions right before carrying out the procedure. For example, hydrogen peroxide can be mixed with a sulfuric acid solution of the nitrogen-containing heterocyclic compound and the adhesion-promoting compound, or a prepared solution can be supplemented directly before use to set the desired concentrations of individual components.

The workpieces with the copper surfaces can be treated in conventional dipping systems. In treating the printed circuit boards, it is particularly good to use so-called continuous systems. The boards are guided along a horizontal transport path through the system. They are brought into contact with the treatment solutions by guiding them through a liquid bed between squeezing rollers located at the beginning and end of the treatment path, and/or bringing them into contact with the treatment liquid using suitable nozzles such as spray or surge nozzles. The printed circuit boards can be held in a horizontal or vertical position or at any other angle.

The following examples serve further to clarify the invention:

EXAMPLE 1

An aqueous solution was created by mixing the following components:

| | |
|---|---|
| Sulfuric acid, 96 weight percent | 50 ml |
| Hydrogen peroxide, 30 weight percent in water | 60 ml |
| Benzotriazole | 10 g |
| Formamidine sulfinic acid | 0.5 g |
| Deionized water added to 1 l. | |

The solution was heated to 40° C., and a copper film (printed circuit board quality, approx. 25 μm thick) was dipped for 60 sec. in the solution. After being treated, the film was rinsed with warm, deionized water and then dried. The copper film had a brownish tint.

The copper film was then laminated to a prepreg (with fiberglass-web-reinforced epoxide resin film (FR4 resin), type 2125 MT, 0.1 μm thick by Dielektra, Germany) by pressing the copper and prepreg films together at 175° C. at a pressure of $2.5 \times 10^6$ Pa (25 Bar).

The peel strength of the copper film on the prepreg film was measured. A peel strength of 9.9–10.6 N/cm was found.

EXAMPLES 2–10

Example 1 was repeated with a solution that had the following components:

| | |
|---|---|
| Sulfuric acid, 96 weight percent | 50 ml |
| Hydrogen peroxide, 30 wt. percent in water | 60 ml | and the components listed in Table 1 (the heterocyclic compound free of S, Se and Te, and the adhesion-promoting compound). Deionized water was added to the created mixtures up to 1 l.

The copper film treated in example 2 had a reddish tint. The copper films treated in Examples 3–10 had a brown tint.

The peel strength was measured in each case as in Example 1. The values obtained for the peel strength are listed in Table 1.

EXAMPLE 11

A copper film was treated as in Example 4; however, before being laminated, the copper film was treated for 20 sec. at room temperature with 10 weight percent hydrochloric acid and then rinsed with deionized water.

A peel strength similar to that of Example 1 was obtained (11.1–11.6 N/cm).

COMPARATIVE EXAMPLE

Example 1 was repeated but with a solution that did not contain any adhesion-promoting compounds.

A peel strength of just 3.6–4.0 N/cm was obtained.

All disclosed features and combinations of disclosed features are the subject of this invention to the extent that they are not expressly described as being prior art.

TABLE 1

| Example | Heterocyclic compound free of S, Se, and Te | Amount of heterocyclic compound used | Adhesion-promoting compound | Amount of adhesion-promoting compound used | Peel strength |
|---|---|---|---|---|---|
| 2 | 5-aminotetrazole hydrate | 6.7 g | Formamidine sulfinic acid | 1 g | 11.6–11.8 N/cm |
| 3 | Benzotriazole | 10 g | 3-aminothiophene-2-carboxylic acid methyl ester | 3.3 g | 8.0–8.4 N/cm |
| 4 | Benzotriazole | 10 g | 2-aminothiazole | 8.0 g | 8.6–8.9 N/cm |
| 5 | Benzotriazole | 10 g | 2-amino-1,2,4-thiadiazole | 3.3 g | 8.5–9.1 N/cm |
| 6 | Benzotriazole | 10 g | Sodium benzenesulfinate | 3.3 g | 9.1 N/cm |
| 7 | Benzotriazole | 10 g | 2-amino-4-oxothiazoline | 3.3 g | 8.7–9.1 N/cm |
| 8 | Benzotriazole | 10 g | Methionine methylsulfoniumchloride | 0.1 g | 9.5 N/cm |
| 9 | Benzotriazole | 10 g | Triphenylsulfoniumchloride, technical | 0.1 g | 9.5 N/cm |
| 10 | Benzotriazole | 10 g | Benzene seienic acid | 0.7 g | 8.7–9.1 N/cm |

What is claimed is:

1. A solution to pretreat copper surfaces so that a tight bond can be subsequently formed between the copper surfaces and plastic substrates containing:
   a Hydrogen peroxide,
   b At least one acid, and
   c At least one nitrogen-containing, five-member heterocyclic compound that does not contain sulfur, selenium or tellurium atoms in the heterocycle, characterized in that the solution additionally contains:
   d At least one adhesion-promoting compound selected from the group consisting of sulfinic acids, selenic acids, telluric acids, heterocyclic compounds that contain at least one sulfur, selenium and/or tellurium atom in the heterocycle, as well as sulfonium, selenonium and telluronium salts, where the sulfonium, selenonium and telluronium salts are compounds of general formula A:

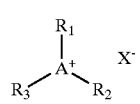

A where A=S, Se or Te,

R$_1$, R$_2$ and R$_3$=alkyl, substituted alkyl, alkenyl, phenyl, substituted phenyl, benzyl, cycloalkyl, substituted cycloalkyl, where R$_1$, R$_2$ and R$_3$ can be the same or different, and X−=anion of an inorganic or organic acid or hydroxide, with the proviso that the acid used for component b is not identical to the sulfinic, selenic or telluric acids used for component d.

2. The solution according to claim 1, characterized in that it contains sulfinic acids selected from the group consisting of aromatic sulfinic acids and compounds of chemical formula B:

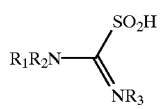
B with R$_4$, R$_5$ and R$_6$ hydrogen, alkyl, substituted alkyl, phenyl, substituted phenyl, R$_7$—(CO)— with R$_7$=hydrogen, alkyl, substituted alkyl, phenyl or substituted phenyl, where R4, R$_5$ and R$_6$ can be the same or different.

3. The solution according to one of the preceding claims 1–2 characterized in that it contains formamidine sulfinic acid as the adhesion-promoting compound.

4. The solution according to one of claims 1–2, characterized in that it contains aromatic sulfinic acids selected from the group consisting of benzene sulfinic acid, toluene sulfinic acids, chlorobenzene sulfinic acids, nitrobenzene sulfinic acids and carboxybenzene sulfinic acids.

5. The solution according to one of the preceding claims 1–2, characterized in that it contains at least one adhesion-promoting heterocyclic compound selected from the group consisting of thiophenes, thiazoles, isothiazoles, thiadiazoles and thiatriazoles.

6. The solution according to claim 5, characterized in that it contains at least one thiophene selected from the group consisting of compounds of chemical formula C:

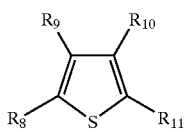
C with R$_8$, R$_9$, R$_{10}$ R$_{11}$=hydrogen, alkyl, substituted alkyl, phenyl, substituted phenyl, halogen, amino, alkylamino, dialkylamino, hydroxy, alkoxy, carboxy, carboxyalkyl, alkoxycarbonyl, aminocarbonyl, R$_{12}$—CONH— with R$_{12}$= hydrogen, alkyl, substituted alkyl, phenyl or substituted phenyl, where R$_8$, R$_9$, R$_{10}$ and R$_{11}$ can be the same or different and can be a part of the homo or heterocyclic ring condensed onto the thiophene ring.

7. The solution according to claim 5, characterized in that it contains at least one thiophene selected from the group consisting of aminothiophene carboxylic acids, their esters and amides.

8. The solution according to claim 5, characterized in that at least one thiazole is selected from the group consisting of compounds with chemical formula D:

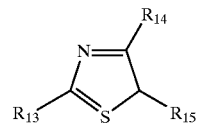
D with R$_{13}$, R$_{14}$, R$_{15}$=hydrogen, alkyl, substituted alkyl, phenyl, substituted phenyl, halogen, amino, alkylamino, dialkylamino, hydroxy, alkoxy, carboxy, carboxyalkyl, alkoxycarbonyl, aminocarbonyl, R$_{16}$—CONH— with R$_{16}$= hydrogen, alkyl, substituted alkyl, phenyl or substituted phenyl, where R$_{13}$, R$_{14}$ and R$_{15}$ can be the same or different and can be a part of the homo or heterocyclic ring condensed onto the thiazole ring.

9. The solution according to claim 5, characterized in that it contains at least one thiazole selected from the group consisting of aminothiazoles and substituted aminothiazoles.

10. The solution according to claim 5, characterized in that it contains at least one thiadiazole selected from the group consisting of aminothiadiazoles and substituted aminothiadiazoles.

11. The solution according to one of the preceding claims 1–2, characterized in that it contains at least one sulfonium salt selected from the group consisting of trimethylsulfonium salts, triphenylsulfonium salts, methionine alkyl sulfonium salts and methionine benzyl sulfonium salts.

12. The solution according to one of the preceding claims 1–2, characterized in that it contains at least one nitrogen-containing, five-member heterocyclic compound selected from the group consisting of triazoles, tetrazoles, imidazoles, pyrazoles and purines.

13. The solution according to claim 12, characterized in that it contains at least one triazole of chemical formula E1:

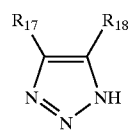
E1 with R$_{17}$, R$_{18}$=hydrogen, alkyl, substituted alkyl, amino, phenyl, substituted phenyl, carboxyalkyl, where R$_{17}$ and R$_{18}$ can be the same or different and can be a part of the homo or heterocyclic ring condensed onto the triazole ring.

14. The solution according to claim 12, characterized in that it contains at least one triazole selected from the group consisting of benzotriazole, methylbenzotriazole, ethyl benzotriazole and dimethylbenzotriazole.

15. The solution according to claim 12, characterized in that it contains at least one tetrazole with the chemical formula E2:

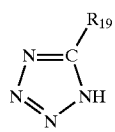
E2 with R$_{19}$=hydrogen, alkyl, substituted alkyl, halogenalkyl, amino, phenyl, substituted phenyl, benzyl, carboxy, carboxyalkyl, alkoxycarbonyl, aminocarbonyl or R$_{20}$—CONH with R$_{20}$=hydrogen, alkyl, substituted alkyl, phenyl or substituted phenyl.

16. The solution according to claim 12, characterized in that it contains at least one tetrazole selected from the group consisting of 5-aminotetrazole and 5-phenyltetrazole.

17. The solution according to one of the preceding claims 1–2 characterized in that sulfuric acid is selected to be the acid for component b in the solution.

18. A process to pretreat copper surfaces to allow a tight bond to be subsequently formed between the copper surfaces and plastic substrates in which the copper surfaces are brought into contact with the solution according to one of claims 1–2.

19. A process to pretreat coppercoated inner layers of printed circuit boards to create a tight bond between the inner layers of the printed circuit boards and layers of artificial resin in which the copper surfaces are brought into contact with the solution according to one of claims 1–2.

20. A process to pretreat coppercoated inner layers of printed circuit boards to create a tight bond between the copper layers and plastic resists in which the copper surfaces are brought into contact with the solution according to one of claims 1–2.

* * * * *